(12) United States Patent
Kamm

(10) Patent No.: US 6,841,786 B2
(45) Date of Patent: Jan. 11, 2005

(54) METHOD AND CONFIGURATION FOR COMPENSATING FOR UNEVENNESS IN THE SURFACE OF A SUBSTRATE

(75) Inventor: Frank-Michael Kamm, Unterhaching (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/652,291

(22) Filed: Aug. 29, 2003

(65) Prior Publication Data

US 2004/0041102 A1 Mar. 4, 2004

(30) Foreign Application Priority Data

Aug. 29, 2002 (DE) .......................................... 102 39 858

(51) Int. Cl.[7] .............................. A61N 5/00; G21G 5/00
(52) U.S. Cl. .............................. 250/492.2; 250/492.22; 250/491.1; 430/258; 430/5
(58) Field of Search ...................... 250/492.2, 492.22; 313/402; 430/258, 5; 438/138

(56) References Cited

U.S. PATENT DOCUMENTS

| | | | | |
|---|---|---|---|---|
| 4,558,949 A | * | 12/1985 | Uehara et al. | 356/139.07 |
| 5,461,237 A | * | 10/1995 | Wakamoto et al. | 250/548 |
| 5,473,424 A | * | 12/1995 | Okumura | 356/139.03 |
| 5,674,101 A | * | 10/1997 | Saloor | 446/46 |
| 5,674,650 A | * | 10/1997 | Dirksen et al. | 430/22 |
| 6,090,510 A | * | 7/2000 | Tokuda | 430/30 |

FOREIGN PATENT DOCUMENTS

| | | |
|---|---|---|
| DE | 199 34 076 A1 | 3/2000 |
| GB | 2 339 960 A | 2/2000 |

OTHER PUBLICATIONS

Author not listed: "Advanced Mask Modeling Study 2001 Final Report", International SEMATECH, pp. 20 and 21.
A. Mikkelson et al.: "Chucking of EUVL Masks", SEMATECH Meeting on "*EUVL Mask Mechanical Fixturing in Write, Metrology, and Exposure Tools*", Santa Clara, California, Mar. 7, 2002, pp. 2–21.

* cited by examiner

*Primary Examiner*—Nikita Wells
*Assistant Examiner*—Johnnie L Smith II
(74) *Attorney, Agent, or Firm*—Laurence A. Greenberg; Werner H. Stemer; Gregory J. Mayback

(57) ABSTRACT

In a EUV reflection mask, the distance from the surface of the mask to an idealized plane is locally measured at a first position. The measured value indicates the mechanical stress caused by the alternating layer sequence of a EUV reflection layer. A local value for a radiation dose of an ion beam, which is used to dope the back surface, is calculated for a counter stress that will be produced on the back surface of the substrate. The lattice structure of the substrate is locally influenced by the doping at the position on the back surface corresponding to the first position on the front surface, and the desired counter stress is thereby generated to compensate for bending caused by the stress. It is advantageously possible to compensate for particular local features in the stress distribution on the substrate, in particular, bending and unevenness of relatively high orders.

14 Claims, 3 Drawing Sheets

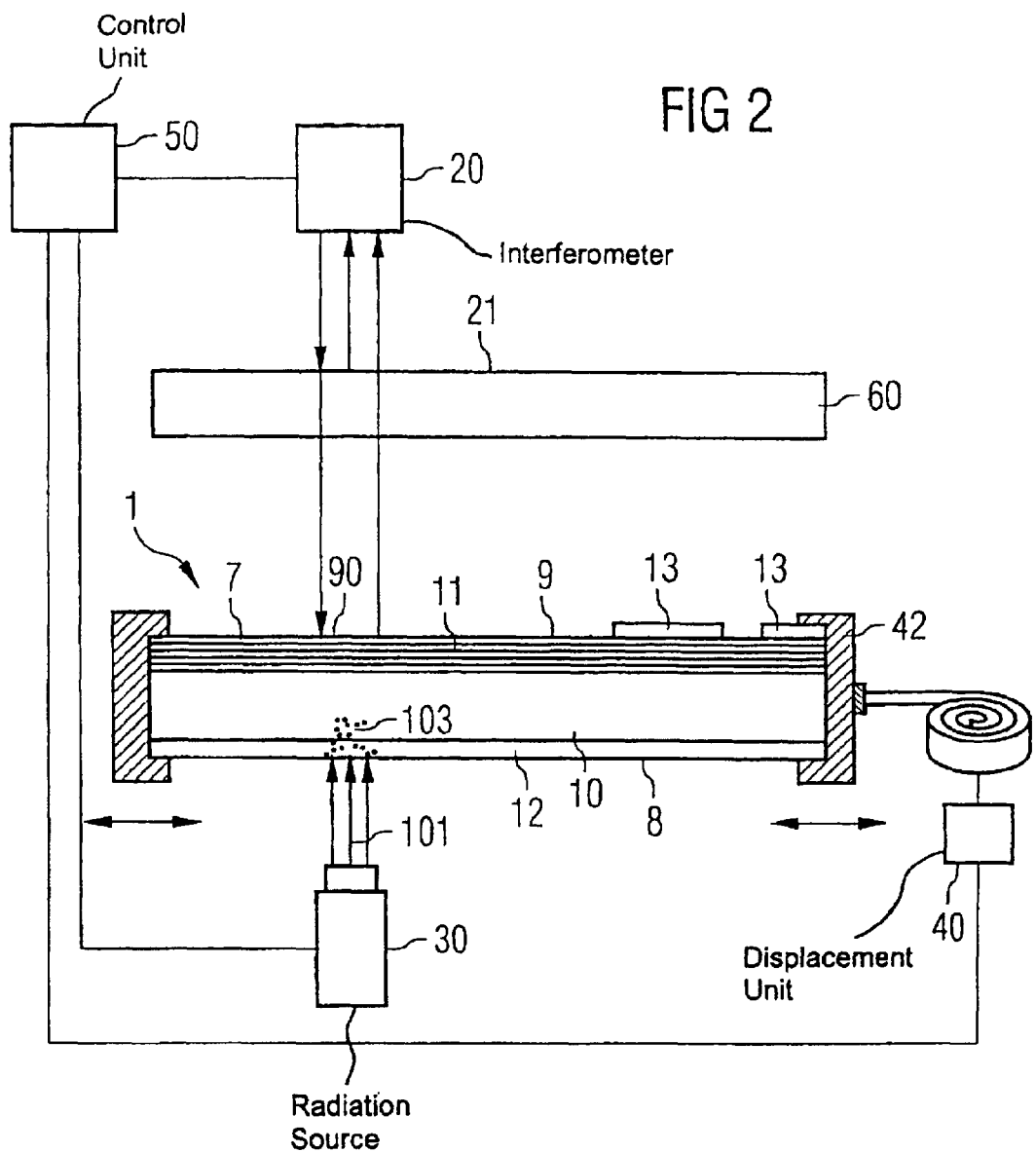

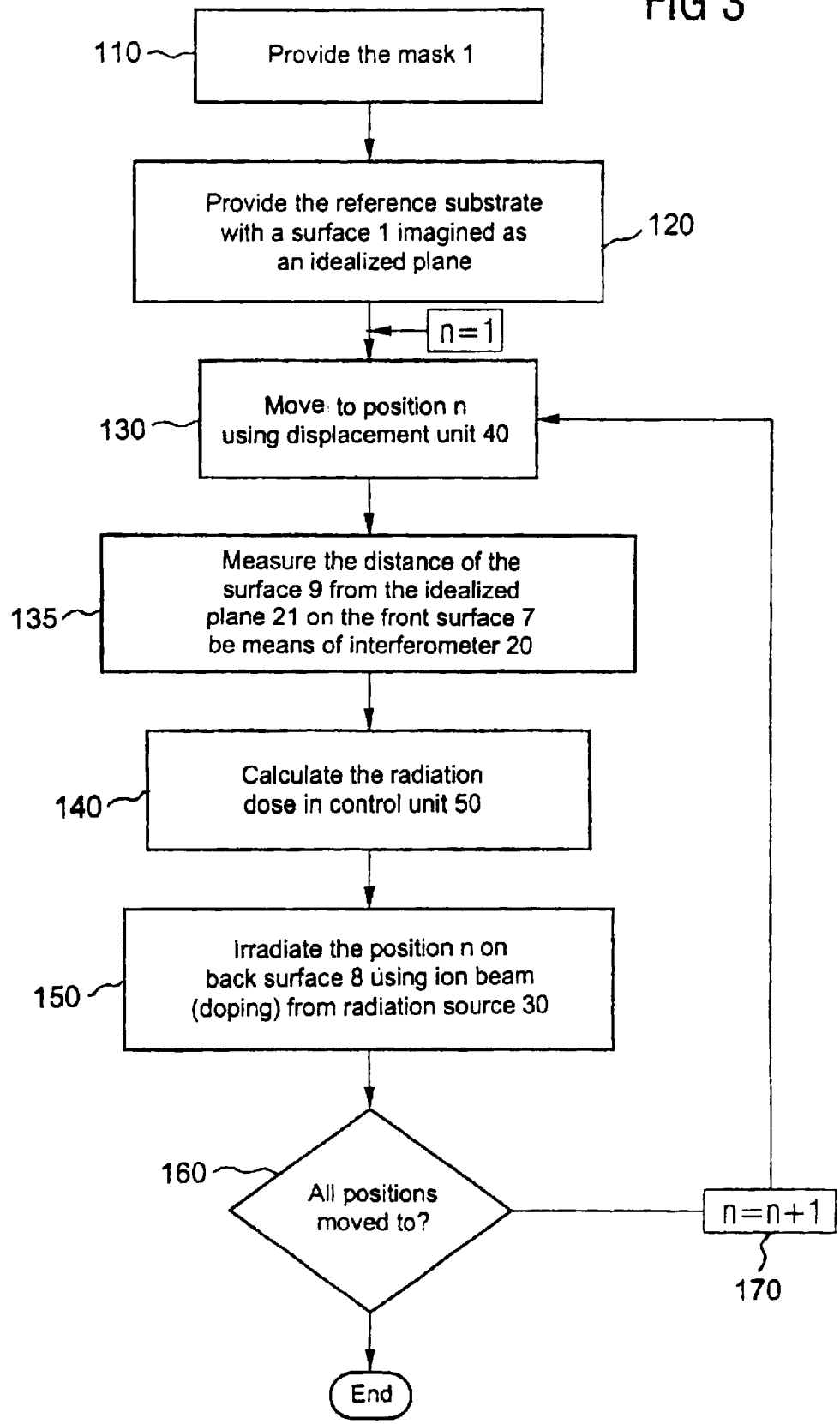

METHOD AND CONFIGURATION FOR COMPENSATING FOR UNEVENNESS IN THE SURFACE OF A SUBSTRATE

BACKGROUND OF THE INVENTION

Field of the Invention

The present invention relates to a method and a configuration for compensating for an unevenness in a surface of a substrate for projecting a pattern onto a semiconductor wafer. The substrate, for example, is a mask that has a carrier material, a front surface, a back surface, and at least one layer arranged on the front surface. The layer at least partially forms the surface having the unevenness. The present invention relates, in particular, to compensating for the unevenness in the case of EUV (extreme ultraviolet) reflection masks that are covered with a layer stack that serves as a reflection layer and that includes an alternating sequence of thin films.

In the field of semiconductor fabrication, masks or reticles are used to transfer a pattern arranged thereon to a semiconductor wafer, a flat panel, etc. in a projection step. What are known as transmission masks, in which, by way of example, opaque patterns are arranged on an otherwise transparent glass substrate, are generally used for this purpose. The masks are irradiated with the light, so that the opaque patterns are reproduced in a substrate plane, i.e. the semiconductor wafer, flat panel, etc.

At the light wavelengths, which are currently being decreased and which are used for projecting mask patterns, the glass substrates used for the masks are becoming increasingly opaque. Therefore, at light wavelengths of less than 157 nanometers, in particular the extreme ultraviolet (EUV) wavelength range of 11-13 nm, there is a move toward using reflection masks for the projection. For this purpose, light is radiated onto the surface of the mask that has been provided with an absorbing structure at an oblique angle of incidence. The substantially opaque substrate of the reflection mask is typically covered with a reflecting layer stack including a layer sequence of thin alternating films. The absorbent layer as a pattern is arranged on the layer stack only at those locations at which shadowing for the projection into the substrate plane is to be produced.

On account of the oblique angle of incidence, i.e. the absence of telecentricity, deviations from a completely planar surface of the mask have an adverse effect on the position of the incident light beam on the mask, whereas this is not so much the case with the transmission masks, which are generally exposed at right angles.

Since with a vertical deviation in the mask surface from an ideal plane of this nature the point of incidence shifts in the horizontal plane, the pattern arranged on the mask is disadvantageously distorted in the projected image in the substrate plane. These so-called out-of-plane distortions (OPDs) are accordingly converted into positional errors within the planes, known as in-plane distortions (IPDs). Depending on the angle of incidence used for the projection light beam, deviation accuracies of 11 nanometers (nm) correspond to the currently specified position error tolerances that are to be maintained by an EUV projection. However, on account of further error sources, a tolerance of only 1 to 2 nm for the IPDs remains for the inaccuracies caused by the unevenness. This value corresponds to a vertical deviation of approximately 50 nm on the mask.

However, a problem of reflection masks, in particular EUV reflection masks is that the layers applied, in particular the alternating layer sequence of the reflection layer, may have a relatively high mechanical stress of more than 400 megapascals and therefore leads to bending of the mask substrate. The stress values given may, for example, cause deviations of more than 1 $\mu$m from an idealized surface plane of the mask. In general, the mechanical stresses caused by the layer stack (multilayer) results in the compressive deformation of the mask, as shown for example, in FIG. 1B. Under certain circumstances, however, a tensile form of stress, as shown in FIG. 1C, is also possible.

As a solution to the problem, the reflection mask has previously been electrostatically pressed with a particularly high pressure onto a particularly planar mask holder (chuck). The bending of a mask caused by a mechanical stress can be mathematically developed, for example, into a series of Legendre polynomals, the lowest orders of which take the form, for example, of saddles. Toward higher orders, the shape of the surface of the mask is increasingly described by a multiplicity of elevations and recesses.

It has been found that by increasing the pressure on the chuck, in particular, only the low-order bending can be satisfactorily reduced, whereas it is not really technically feasible to sufficiently compensate for higher-order bending using pressure.

Irrespective of the bending of a mask by mechanical stresses, unevenness is formed on the surface of the mask, partly on account of the level of accuracy achieved during the polishing of the mask substrate. Production-induced roughness, i.e. the high-frequency components of elevations and recesses on the surface, is reduced by polishing of this nature. However, in this case the problem arises that, on account of the polishing, low-frequency components, i.e. low orders in the deviations from an idealized, planar surface, are formed at the same time. Since the back surface is not generally treated simultaneously, these low-frequency components cannot be compensated for by increasing the electrostatic pressure on the chuck in the manner described above.

Therefore, the object was set of providing reflection masks having a substrate and a reflection coating formed thereon which simply does not have the abovementioned unevenness, of both low and high frequency components or orders, from the outset. One approach in this respect consists in providing the back surface of the reflection masks with a layer that exerts a substantially identical stress on the substrate to that exerted on the front surface of the reflection mask by the alternating layer sequence. However, in this case, the effects of the buffer and absorber layers which are generally used on reflection masks should additionally be taken into account. However, since the buffer and absorber layers are the subject of patterning on the reflection mask, this may in particular lead to local deviations in the mechanical stress exerted. However, in practice, effects of this nature, as well as effects whereby the back surface coating has to compensate not only for the low-order bending, but also for the higher-order bending, are often rarely achievable.

SUMMARY OF THE INVENTION

It is accordingly an object of the invention to provide a method and a configuration for compensating for the unevenness on the surfaces of reflection masks, which overcome the above-mentioned disadvantages of the prior art apparatus and methods of this general type.

In particular, it is an object of the invention to provide a method and a configuration with which local unevenness as well as higher-order unevenness can be compensated for. Moreover, it is an object of the present invention to permanently compensate for the stress caused on a reflection mask by layers applied to the front surface.

The object is achieved by a method for compensating for the unevenness in the surface of a substrate. The substrate includes a carrier material, a front surface, a back surface, and at least one layer arranged on the front surface. This layer at least partially forms the surface. The method includes providing the substrate, a distance-measuring appliance, and a radiation source for generating a light, ion or electron beam. The method includes defining an idealized plane, which is substantially parallel to the front surface of the substrate. The method includes selecting a first position on the front surface of the substrate, and at the first position, measuring a first value for a distance, which represents the unevenness, between the surface of the layer on the substrate and the idealized plane using the distance-measuring appliance. The method includes calculating a first radiation dose for generating a light, ion or electron beam as a function of the measured first value. The method then includes locally irradiating the back surface of the substrate with the calculated first radiation dose of the light, ion or electron beam from the radiation source at a position on the back surface of the substrate located opposite the first position on the front surface in order to generate a local mechanical stress in order to compensate for the unevenness.

The present invention is based on the principle of measuring a deviation of the actual surface from an idealized, planar surface. This deviation is measured locally on the front surface of the substrate in order, on the basis of the magnitude of the deviation, to effect a physical action, which is matched to this magnitude, at precisely the corresponding position on the back surface. This physical action acts on the face of the back surface or acts with a characteristic penetration depth into a region close to the surface, so that here a mechanical counter stress is locally induced, which preferably compensates for the mechanical stress which causes the unevenness on the front surface.

However, it is also possible for the method to be used on a substantially stress-free front surface with the unevenness caused, for example, by polishing processes.

The physical action on the back surface by way of an ion, electron or light beam changes the lattice structure of the carrier material and/or the lattice structure of a back-surface coating arranged thereon, in such a manner that a desired bending of the substrate is induced by a compressive or tensile stress on the back surface of the substrate.

According to an advantageous configuration of the invention, the substrate may be a mask, in particular, an EUV reflection mask.

According to a first configuration, an ion beam is used to locally irradiate a position on the back surface of the mask; by way of example, a focused ion beam (FIB) can be used. However, it is preferable to use larger-area beam diameters, for example, in the range from 0.1 to 5 mm, in order to reduce the irradiation times. The physical action in this case involves doping the substrate and/or a back surface coating with foreign atoms, the atomic radii of which, in order to produce a compressive stress, are preferably greater than those of the atomic radii that are already present in the substrate and/or the back surface coating. These foreign atoms are preferably argon ions.

In particular if the doped carrier material or the doped layer has an amorphous structure, but also for crystalline structures, it is for example, also particularly advantageously possible to use boron, which has a smaller atomic radius. The atoms in this case do not replace atoms at lattice positions, but rather are additionally incorporated in the lattice, so that a compressive stress is produced. In this case, it is possible to dispense with the conditioning process that is otherwise required in order to occupy the lattice positions with the ions.

According to the invention, the possibility of using materials other than those mentioned above is not ruled out. Moreover, in particular the elements phosphorus, antimony, nitrogen, arsenic, gallium, etc. may also be considered, as well as other standard dopants used in in semiconductor fabrication.

According to a second configuration of the present invention, a light beam, for example, from a laser, is used in order to thermally induce a local phase transformation on the back surface of the mask. This too makes it possible to alter the lattice structure on the back surface of the mask.

The crucial factor is that a local correction can be carried out on the back surface of the mask as a function of the recorded deviation from the idealized plane, which is a measure of the local stress on the front surface of the mask. According to a further configuration, for this purpose, the local deviations on the front surface are measured at a plurality of positions and are then individually compensated for by in each case using a different dose of the ion or light radiation on the back surface.

The front surface of the mask, on which the multilayer including the alternating layer sequence of the reflection layer, the buffer layer and the absorber layer is located, is ideally scanned in order to measure the local deviations or distances of the actual surface from the idealized plane, so that a map of the mask showing the deviations, for example the bending, of the mask is formed. If the local curvature of the surface is considered as a measure of the stress on the front surface of the mask, a local curvature, and thereby a local stress, can be calculated from this map for each position using the values measured in the surrounding area. A map produced in this way including a distribution of the stresses over the surface of the mask can then be transferred in mirror-image fashion onto the back surface of the using the radiation source.

Since patterns in the buffer and/or in the absorber layer are also arranged on the front surface, which can lead to bending of very high order, it is particularly advantageous if a map of the measured deviations is stored in a database and is permanently assigned to a given design layout. The radiation or doping of the back surface of a reflection mask can in this case be reused for the given layout by anybody responsible for a mask.

However, it is also possible to locally measure the deviation and, by using a coupling to the radiation source, to immediately locally irradiate the back surface at the back-surface position corresponding to the measured position on the front surface on the basis of the measured magnitude of the deviation. In this way, it is possible to scan the front surface and back surface of the mask in a time-saving manner and without the need for complicated adjustment for each of the steps in accordance with the method of the invention.

The measurement of the deviation of the actual surface from an idealized plane is preferably carried out with respect to a highly planar reference substrate. This may be an uncoated substrate, which is therefore not subject to any particular mechanical stresses. In this case, according to one configuration of the invention, the distance measurement is preferably carried out by interferometry.

However, it is also possible for the face of the front surface of the mask to be measured using absolute height coordinates, after which an idealized plane can then be calculated from the data. Statistic methods can be used to do this.

According to a further configuration, the invention can also be applied to the treatment of an unevenness in the case of reflection optics that are used, for example, in the EUV wavelength region. These include the optics of microscopes or steppers or scanners used for fabricating semiconductor circuits. The invention can also be used in reflection optics that are used in telescopes, for example, in X-ray satellites.

With the foregoing and other objects in view there is provided, in accordance with the invention, a configuration for compensating for unevenness on a surface of a substrate caused by a mechanical stress. The configuration includes an interferometer for measuring a distance between a position on the surface of the substrate and an idealized plane. The configuration also includes a control unit for calculating a radiation dose from a value of the distance measured between the position on the surface of the substrate and the idealized plane. The control unit is connected to the interferometer. The configuration also includes a radiation source for generating a light beam, an ion beam, or an electron beam having a diameter being less than a diameter of the substrate. The control unit is connected to the radiation source for controlling a radiation dose for irradiating a back surface of the substrate. The configuration also includes a displacement unit for displacing the substrate, the interferometer and the radiation source relative to one another for actuating a number of positions being measured and irradiated. This displacement unit is connected to the control unit.

Other features which are considered as characteristic for the invention are set forth in the appended claims.

Although the invention is illustrated and described herein as embodied in a method and configuration for compensating for unevenness in the surface of a substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is schematic diagram of an inventive configuration for compensating for a stress on a reflection mask; and FIG. 3 is a flow diagram of the steps of an exemplary embodiment of a method for compensating for unevenness on the surface of a mask.

DESCRIPTION OF THE PREFERRED EMBODIMENTS

Figure 1A:
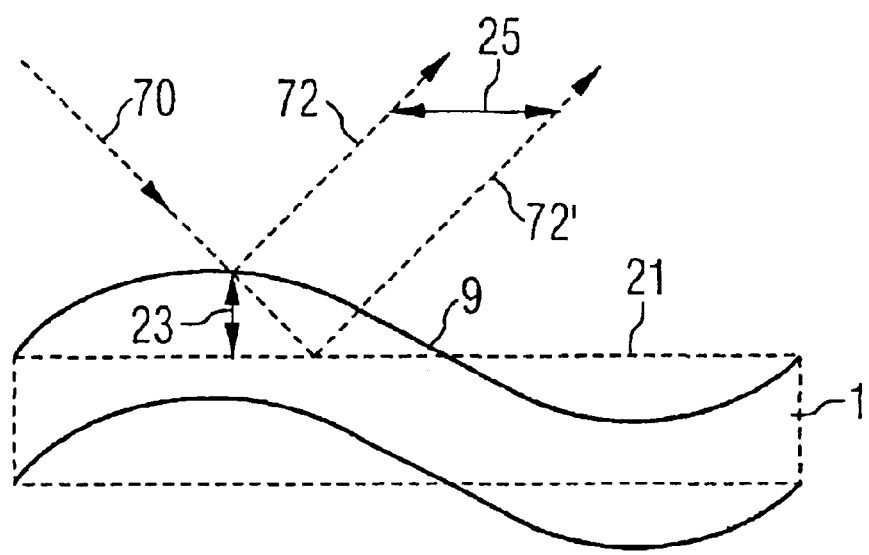
FIG. 1A is schematic diagram of a reflection mask undergoing bending, which is induced by a mechanical stress, resulting in a distortion of the imaging.
Figure 1B:
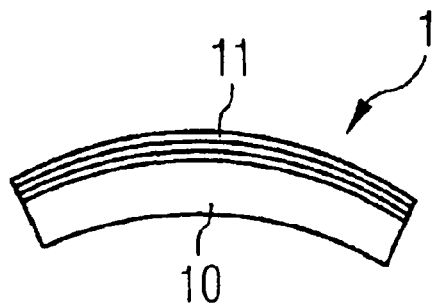
FIG. 1B is schematic diagram of a reflection mask being bent by a compressive stress.
Figure 1C:
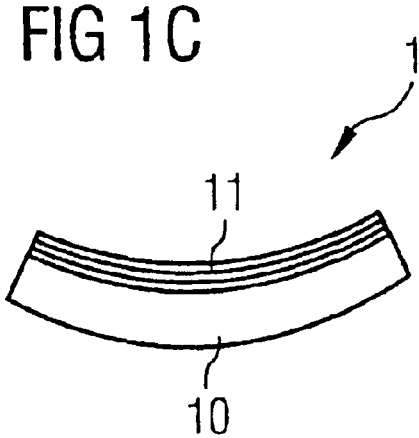
FIG. 1C is schematic diagram of a reflection mask being bent by tensile stress.

Referring now to the figures of the drawing in detail and first, particularly, to FIG. 1A thereof, there is shown a reflection mask described in the introduction undergoing bending caused by a mechanical stress. A reflection mask 1 with a surface 9 has been bent in such a manner that at one position it has an unevenness that is at a vertical distance 23 from an idealized, planar surface 21 of the unbent substrate. A light beam 70, which is incident for the purpose of projecting a pattern from a mask onto a semiconductor wafer, strikes the surface 9 of the mask 1 at this position and is reflected toward the semiconductor wafer as reflected light beam 72. If the unevenness had not formed on the mask 1, that is, in the case of the absence of bending, the light beam 70 would have been incident on the idealized, planar surface of the mask 1 at a further position next to the first position and would have been reflected as light beam 72'. Accordingly, the resulting pattern has been imaged on the substrate with a position error 25.

An example of the configuration is illustrated in FIG. 2. A reflection mask 1 is arranged in a mask holder 42 or a chuck which can be moved by a displacement unit 40. The reflection mask 1 includes a multilayer 11 as a reflection layer and non-reflecting absorber structures 13 on a front surface 7. The substrate consists of the LTE material (low thermal expansion material) that is customary for EUV reflection masks, for example, the LTE material sold under the trademark ULE by Corning or the LTE material sold under the trademark ZERODUR by Schott. A back surface coating 12 made from electrically conductive material is arranged on the back surface 8. To carry out an interferometry measurement, a reference substrate 60 including an LTE material as the substrate, with a surface 21 considered as an idealized plane, is located above, parallel to, and at a distance from the surface 9 of the front surface 7 of the reflection mask 1.

The configuration includes the interferometer 20, which can emit a light that is transmitted through the LTEM substrate 60 onto the surface 9 of the mask 1. The interferometer 20 is connected to a control unit 50, which can convert the distance values measured by the interferometer 20 into a radiation dose for an ion or light beam 101 that will be emitted onto the back surface of the reflection mask 1. To enable the dose for the beam 101 of the radiation source 30 to be controlled, the radiation source 30 is also connected to the control unit 50. In order to scan the front and back surfaces 7, 8 of the reflection mask 1, the control unit 50 is also connected to the displacement unit 40, so that it is possible to move to any desired position on the front and/or back surface 7, 8 of the reflection mask.

An example of a sequence according to the invention is presented in FIG. 3. After the mask 1 (step 110) and the reference substrate 60 have been provided (step 120), first of all, a first position is moved to using the displacement unit 40 (step 130). In the process, both the mask 1 with the chuck 42, which only acts on the sides, and the interferometer 20 and the ion beam source 30 can be moved individually or together relative to one another.

Then, the distance 23 between the surface 9 and the idealized plane 21 on the front surface 7 of the mask 1 is measured by the interferometer 20 (step 135). When this step has been repeated n times, the control unit already has a local surface profile. A local value for the mechanical stress can be calculated in the control unit 50 from the curvature or even higher deviations of the profile of the surface 9, which in particular, incorporates the value of the current local measurement.

The control unit also stores a table which, for the present substrate 10 of the mask 1, assigns values for radiation doses for argon ions that will be implanted to values for mechanical stresses in the resulting doped substrate 10. The value for the radiation dose assigned to the mechanical stress determined is selected or interpolated (step 140).

Then, the control unit controls the ion beam source in such a manner that argon ions with the calculated radiation dose are implanted into the substrate 10 and a back surface coating 12 arranged thereon at back surface positions that precisely correspond to the front surface positions, in order to form a doped region 103 in the vicinity of the back surface (step 150). In this way, a number of positions, advantageously a scanned grid, are moved to and are locally irradiated in a loop (steps 160 and 170).

It should now be within the ability of one of ordinary skill in the art to also select two different displacement units 40 for the interferometer 20 and the radiation source 30 respectively or to select different positions for the interferometer 20 and the radiation source 30, but the mask then has to be adjusted between the interferometer and the radiation source for each step of the loop, i.e. for each back surface position.

I claim:

1. A method for compensating for unevenness, which comprises:
    providing a light-reflecting substrate having a carrier material, a front surface, a back surface, and at least one layer configured on the front surface, the layer at least partially forming a surface having an unevenness;
    providing a distance-measuring appliance and a radiation source for generating a light beam, an ion beam or an electron beam;
    defining an idealized plane substantially parallel to the front surface of the substrate;
    selecting a first position on the front surface of the substrate;
    at the first position, measuring a first value for a distance between the surface of the layer and the idealized plane using the distance-measuring appliance, the distance representing the unevenness;
    calculating a first radiation dose for the light beam, the ion beam or the electron beam as a function of the first value; and
    generating a local mechanical stress to compensate for the unevenness by locally irradiating a position on the back surface of the substrate with the first radiation dose of the light beam, the ion beam or the electron beam from the radiation source;
    the position on the back surface of the substrate located opposite the first position on the front surface.

2. The method according to claim 1, which further comprises providing the substrate as a mask for projecting a pattern onto a semiconductor wafer.

3. The method according to claim 2, which further comprises:
    selecting a second position on the front surface of the substrate;
    measuring a second value for a distance at the second position;
    calculating a second radiation dose from the second value; and
    locally irradiating a position on the back surface of the substrate with the second radiation dose, the position on the back surface lying opposite the second position on the front surface, and the first radiation dose having a different value than the second radiation dose.

4. The method according to claim 2, which further comprises:
    selecting at least one second position on the front surface of the substrate; and
    repeating steps of:
        measuring a second value for a distance at the second position,
        calculating a second radiation dose from the second value, and
        locally irradiating a position on the back surface of the substrate with the second radiation dose, the position on the back surface lying opposite the second position on the front surface, and the first radiation dose having a different value than the second radiation dose.

5. The method according to claim 2, which further comprises forming the idealized plane with a surface of a substantially stress-free reference substrate.

6. The method according to claim 2, which further comprises using an interferometer as the distance-measuring appliance.

7. The method according to claim 2, which further comprises:
    providing the mask as a reflection mask for reflecting light in a wavelength range below 157 nanometers; and
    providing the front surface of the substrate with an alternating layer stack including a periodic layer sequence of molybdenum and silicon or a periodic layer sequence of molybdenum and beryllium, the layer stack including the layer.

8. The method according to claim 2, which further comprises prior to the irradiating step, applying a coating of an electrically conductive material to the back surface of the substrate.

9. The method according to claim 2, which further comprises prior to the irradiating step, applying a coating of at least one electrically conductive material selected from a group consisting of a metal and a semiconductor to the back surface of the substrate.

10. The method according to claim 2, which further comprises:
    performing the irradiating step with the ion beam from the radiation source to dope the carrier material or to dope a coating on the back surface of the substrate; and
    obtaining ions in the ion beam from at least one element selected from a group consisting of argon, boron, arsenic, nitrogen, antimony, phosphorus and gallium.

11. The method according to claim 2, which further comprises providing the radiation source as a laser for performing a local phase transformation of a lattice structure in the carrier material or in a coating on the back surface of the substrate.

12. The method according to claim 1, wherein the substrate is a reflection optics system used in an enlarging imaging system or reducing imaging system.

13. A configuration for compensating for an unevenness on a surface of a substrate caused by a mechanical stress, the configuration comprising:
    an interferometer for measuring a distance between a position on the surface of the substrate and an idealized plane;
    a control unit for calculating a radiation dose from a value of the distance measured between the position on the surface of the substrate and the idealized plane, said control unit connected to said interferometer;
    a radiation source for generating a light beam, an ion beam, or an electron beam having a diameter being less than a diameter of the substrate, said control unit connected to said radiation source for controlling a radiation dose for irradiating a back surface of the substrate; and a displacement unit for displacing the substrate, said interferometer and said radiation source relative to one another for actuating a number of positions being measured and irradiated, said displacement unit connected to said control unit.

14. The configuration according to claim 13, in combination with the substrate, wherein:

the substrate has a carrier material with a front surface, and at least one layer configured on the front surface;

the layer generates the stress; and the layer has the surface with the unevenness.

* * * * *